United States Patent
Willemin et al.

(10) Patent No.: US 9,188,957 B2
(45) Date of Patent: Nov. 17, 2015

(54) CIRCUIT FOR AUTOREGULATING THE OSCILLATION FREQUENCY OF AN OSCILLATING MECHANICAL SYSTEM AND DEVICE INCLUDING THE SAME

(71) Applicant: The Swatch Group Research and Development Ltd, Marin (CH)

(72) Inventors: Michel Willemin, Preles (CH); Jean-Claude Martin, Montmollin (CH)

(73) Assignee: The Swatch Group Research and Development Ltd., Marin (CH)

( * ) Notice: Subject to any disclaimer, the term of this patent is extended or adjusted under 35 U.S.C. 154(b) by 0 days.

(21) Appl. No.: 13/658,260

(22) Filed: Oct. 23, 2012

(65) Prior Publication Data
US 2013/0107677 A1 May 2, 2013

(30) Foreign Application Priority Data

Oct. 28, 2011 (CH) ........................................ 1741/11

(51) Int. Cl.
*G06F 1/04* (2006.01)
*G04B 17/00* (2006.01)
*G04B 17/20* (2006.01)
(Continued)

(52) U.S. Cl.
CPC ................. *G04B 17/06* (2013.01); *G04B 18/00* (2013.01); *G04C 3/04* (2013.01); *G04C 3/042* (2013.01); *G04C 3/047* (2013.01); *G04C 3/067* (2013.01); *G04C 3/068* (2013.01); *G04C 3/069* (2013.01); *G04C 11/002* (2013.01); *G04D 7/10* (2013.01); *H03H 9/02409* (2013.01)

(58) Field of Classification Search
USPC .................................. 368/158, 169–171, 175
See application file for complete search history.

(56) References Cited

U.S. PATENT DOCUMENTS

| 4,435,667 | A | * | 3/1984 | Kolm et al. | .................. 310/367 |
| 6,091,671 | A | * | 7/2000 | Kattan | ......................... 368/113 |

(Continued)

FOREIGN PATENT DOCUMENTS

| EP | 0 762 243 A1 | 3/1997 |
| EP | 0 822 470 A1 | 2/1998 |

(Continued)

OTHER PUBLICATIONS

European Search Report issued Jan. 18, 2012, in European Patent Application No. 11187360.

*Primary Examiner* — Amy Cohen Johnson
*Assistant Examiner* — Daniel Wicklund
(74) *Attorney, Agent, or Firm* — Oblon, McClelland, Maier & Neustadt, L.L.P.

(57) ABSTRACT

A single electronic module includes a autoregulating circuit that regulates an oscillation frequency of an oscillating mechanical system, such as a balance having a balance spring. A piezoelectric element is mounted on the oscillating balance spring and connected to the autoregulating circuit to generate an alternating voltage. The autoregulating circuit rectifies the alternating voltage and regulates the alternating voltage frequency. The rectified voltage is stored in a capacitor to power the autoregulating circuit. The autoregulating circuit includes an oscillator connected to a mirco-electro-mechanical system (MEMS) resonator that supplies a reference signal, and compares the frequency of the alternating voltage to the reference signal frequency. The autoregulating circuit supplies frequency adaptation signal to the piezoelectric element according to the result of the comparison, in order to regulate the oscillation frequency of the balance.

16 Claims, 2 Drawing Sheets

(51) Int. Cl.
- *G04B 17/06* (2006.01)
- *G04C 3/06* (2006.01)
- *G04C 3/04* (2006.01)
- *G04C 11/00* (2006.01)
- *G04B 18/00* (2006.01)
- *H03H 9/02* (2006.01)
- *G04D 7/10* (2006.01)

(56) References Cited

U.S. PATENT DOCUMENTS

| | | |
|---|---|---|
| 6,194,878 B1 | 2/2001 | Schafroth |
| 2004/0004520 A1* | 1/2004 | Giousouf et al. ............. 331/154 |
| 2004/0041643 A1 | 3/2004 | Giousouf et al. |
| 2005/0162239 A1* | 7/2005 | Lutz et al. .................... 333/186 |
| 2006/0033589 A1* | 2/2006 | Partridge et al. .............. 331/154 |
| 2010/0283556 A1* | 11/2010 | Hessler et al. ................ 333/197 |
| 2013/0051191 A1* | 2/2013 | Schafroth .................... 368/175 |

FOREIGN PATENT DOCUMENTS

| | | |
|---|---|---|
| FR | 2119482 | 8/1972 |
| JP | 2002-228774 | 8/2002 |
| WO | WO 2011/131784 A1 | 10/2011 |
| WO | WO 2011131784 A1 * | 10/2011 |

* cited by examiner

CIRCUIT FOR AUTOREGULATING THE OSCILLATION FREQUENCY OF AN OSCILLATING MECHANICAL SYSTEM AND DEVICE INCLUDING THE SAME

This application claims priority from Swiss Patent Application No. 01741/11 filed Oct. 28, 2011, the entire disclosure of which is incorporated herein by reference.

FIELD OF THE INVENTION

The invention concerns a circuit for autoregulating the oscillation frequency of an oscillating mechanical system.

The invention also concerns a device comprising the oscillating mechanical system and the circuit for autoregulating the oscillation frequency of the oscillating mechanical system.

BACKGROUND OF THE INVENTION

In the field of horology, the oscillating mechanical system may be a balance on which a balance spring is mounted, one end of which is secured to the rotating balance staff and the other end of which is secured to a fixed element of a bottom plate. The oscillation of the mechanical system is maintained via an energy source which is generally mechanical. This energy source may be, for example, a barrel driving a gear train with an escape wheel cooperating with a pallet lever. This rotating pallet lever for example actuates a pin secured in proximity to the rotating balance staff. The balance with the balance spring may thus form a regulating member of a timepiece movement. This oscillating regulating member determines the driving speed of the gear train with the escape wheel leading to the time indicator hands.

In order to precisely regulate the oscillation frequency of the oscillating mechanical system, the length of the spring may be adapted or a weight may be added or removed from the external circular part of the balance. However in the case of a wristwatch, all these additional regulating elements occupy considerable space inside the watch case, and lead to relatively long manufacturing time and high cost. This thus constitutes drawbacks.

In a mechanical or electromechanical watch, it is known to regulate the rotational speed of an electric generator connected to the spiral-shaped spring barrel to mechanically drive the hands of the watch via a gear train. The electric generator generates an alternating voltage, which is rectified by means of a rectifier of an electronic regulating circuit. The function of this regulating circuit is to control the rotational speed of the generator so that the time indicator hands can be moved as a function of the correct current time indication. A transistor of the regulating circuit can short-circuit the generator at determined time periods so as to brake the generator and thus regulate the rotational speed. EP Patent Application Nos. 0 762 243 A1 or 0 822 470 A1, which disclose a watch provided with this type of regulating circuit may be cited in this regard.

The aforementioned electric generator includes rotating permanent magnets and a coil opposite the magnets, capable of providing an induced alternating voltage. It can be complicated to make this type of generator and regulating circuit. A large number of elements generally have to be provided to design said generator with the regulating circuit. Moreover, the magnetic field of the rotating magnets may cause interference in some nearby ferromagnetic parts. This therefore constitutes several drawbacks.

Instead of an electric generator formed of rotating permanent magnets and a coil generating an induced alternating voltage, FR Patent No. 2 119 482 has already proposed providing an oscillating mechanical system with a piezoelectric element. This piezoelectric element is preferably arranged on a balance spring connected to a balance. To achieve this, films of piezoelectric material (PZT) are deposited on most of the length of the spring and on an inner face and outer face of said metal spring. A voltage converter supplies an alternating voltage to the piezoelectric element to alternately generate a compression force and an extension force on the spring in order to regulate the oscillation of the balance connected to the balance spring. However, in this Patent document, no mention is made of regulating the oscillation frequency of the balance with the balance spring using an autoregulating circuit, which is a disadvantage.

Regulating the oscillation frequency of a balance combined with a piezoelectric balance spring as the alternating voltage generator is known from JP Patent Application No. 2002-228774. The alternating voltage is rectified in a rectifier which comprises at least two diodes and FET transistors controlled by the electronic regulating circuit. The rectified voltage is stored at least in a supply voltage storage capacitor. The electronic circuit may be powered directly by the alternating voltage from the generator, which has been rectified and stored in the capacitor. The piezoelectric generator is of the bimetal type (PZT). To regulate the oscillation frequency, a comparison is made between a signal at a reference frequency supplied by a quartz oscillator circuit and the alternating signal from the generator. With the proposed electronic circuit it is not possible to devise a very compact oscillating mechanical system with the regulating circuit in a manner that is easily accomplished, which constitutes a drawback.

SUMMARY OF THE INVENTION

It is therefore an object of the invention to provide a compact autoregulating circuit in order to precisely regulate the oscillation frequency of an oscillating mechanical system, with a limited number of components, and to overcome the aforementioned drawbacks of the state of the art.

The invention therefore concerns a circuit for autoregulating the oscillation frequency of an oscillating mechanical system, wherein the mechanical system includes a piezoelectric or electroactive polymer element capable of generating an alternating voltage following the oscillation of the mechanical system, the autoregulating circuit being intended to be connected to the piezoelectric or electroactive polymer element to adapt the oscillation frequency of the oscillating mechanical system, and the autoregulating circuit comprising:

a rectifier for rectifying the alternating voltage generated by the piezoelectric or electroactive polymer element and for storing the rectified voltage in at least one capacitor in order to supply the autoregulating circuit with electricity, an oscillator stage, which includes an oscillating circuit connected to a MEMS resonator, to supply a reference signal, a means of comparison for comparing the frequency of the alternating voltage to the frequency of the reference signal, a frequency adaptation unit intended to be connected to the piezoelectric or electroactive polymer element to supply a frequency adaptation signal to the piezoelectric or electroactive polymer element on the basis of the result of the comparison in the comparison means in order to regulate the oscillation frequency of the oscillating mechanical system, and all the electronic components of the autoregulating circuit being grouped together to form a single electronic module, wherein the comparison means includes a first alternation counter for counting a first number of alternations of the alternating voltage of the piezoelectric or electroactive polymer element in a first determined time period and for supplying a first counting signal, a second alternation counter for counting a second number of alternations of the reference signal supplied by the oscillator stage in a second determined time period partly on the basis of the first determined time period and for supplying a second counting signal, and a processor unit for comparing the first counting signal to the second counting signal so as to control the frequency adaptation unit on the basis of the result of the comparison.

Specific embodiments of the autoregulating circuit are defined in the dependent claims 2 to 10.

One advantage of this autoregulating circuit according to the invention lies in the fact that it can be made in the form of a single electronic module, which can be connected directly or via two electric wires to the piezoelectric element or electroactive polymer element arranged on the oscillating mechanical system. This oscillating mechanical system may preferably be a balance on which a balance spring is arranged, which includes the piezoelectric or electroactive polymer element.

Advantageously, the autoregulating circuit includes an oscillator stage connected to a MEMS resonator, which may be placed or made on, beside or in the same substrate integrating other components of said autoregulating circuit. In this manner, the autoregulating circuit with all these components forms a single compact component. This considerably reduces the dimension of the oscillating mechanical system with its oscillation frequency autoregulating circuit, so that it can advantageously be mounted in a mechanical wristwatch.

Advantageously, the autoregulating circuit can apply an adaptive voltage to generate a compression or extension force continuously or at determined time periods on the piezoelectric or electroactive polymer element. This allows the oscillation frequency of the oscillating mechanical system to be regulated. In this regard, a comparison is made between the frequency of a reference signal generated via the oscillator stage and the frequency of the alternating voltage generated by the piezoelectric element or by the electroactive polymer element.

The invention therefore also concerns a device including the oscillating mechanical system and the circuit for autoregulating the oscillation frequency of the oscillating mechanical system, wherein the oscillating mechanical system includes a piezoelectric or electroactive polymer element for generating an alternating voltage at a frequency matching the oscillation frequency of the oscillating mechanical system, two terminals of the piezoelectric or electroactive polymer element being connected to the autoregulating circuit so as to receive from the autoregulating circuit a frequency adaptation signal on the basis of a frequency comparison between the alternating voltage and a reference signal from an oscillator stage of the autoregulating circuit.

Specific embodiments of the device are defined in the dependent claims 12 to 15.

BRIEF DESCRIPTION OF THE DRAWINGS

The objects, advantages and features of the oscillation frequency autoregulating circuit for an oscillating mechanical system and the device including the same will appear more clearly in the following description made with reference to at least one non-limiting embodiment, illustrated by the drawings, in which.

DETAILED DESCRIPTION OF THE INVENTION

In the following description, all those electronic components of the oscillation frequency autoregulating circuit for an oscillating mechanical system that are well known to those skilled in the art in this technical field will be described only in a simplified manner. As described below, the autoregulating circuit is mainly used for regulating the oscillation frequency of a balance on which there is mounted a balance spring with a piezoelectric or electroactive polymer element. However, other oscillating mechanical systems may also be envisaged, for example an acoustic system such as a tuning fork, but in the following description, reference will be made only to an oscillating mechanical system in the form of a balance with a balance spring comprising a piezoelectric element or electroactive polymer (EAP) element.

Figure 1:
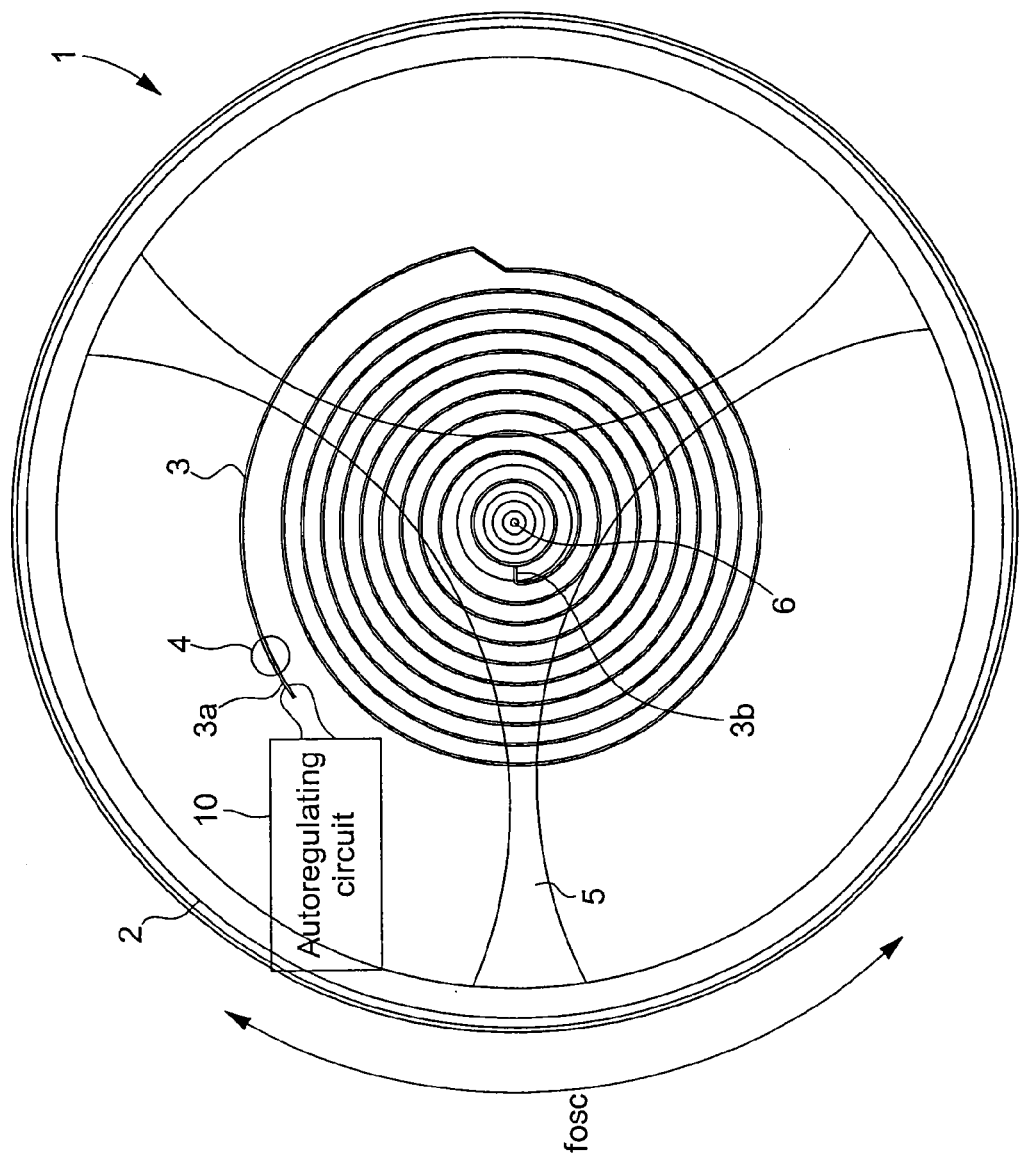
FIG. 1 shows a simplified view of a device, which includes an oscillating mechanical system and an oscillation frequency autoregulating circuit for the oscillating mechanical system according to the invention.

FIG. 1 shows a device 1, which includes an oscillating mechanical system 2, 3 and a circuit 10 for autoregulating the oscillation frequency fosc of the oscillating mechanical system. In a mechanical watch, the oscillating mechanical system may include a balance 2 which is formed of a metal ring connected, for example, by three arms 5 to a rotating staff 6, and a balance spring 3, on which there is arranged a piezoelectric element or an electroactive polymer element briefly explained below. A first end 3a of balance spring 3 is fixedly held by a balance stud 4 of a balance bar (not shown). This balance bar is secured to a bottom plate (not shown) of the watch movement. A second end 3b of balance spring 3 is directly secured to the rotating balance staff 6.

The oscillation of balance 2 with its balance spring 3 is maintained via an energy source (not shown), which may be electric, but is preferably mechanical. This mechanical energy source may be a barrel, which conventionally drives a gear train with an escape wheel cooperating with a pallet lever. This rotating pallet lever for example actuates a pin secured in proximity to the rotating balance staff. The balance with the balance spring may thus form a regulating member of a timepiece movement.

Figure 2:
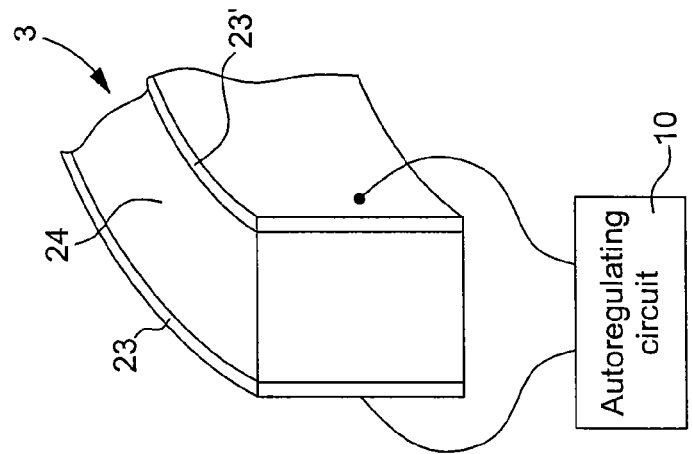
FIG. 2 shows a portion of a balance spring of the oscillating mechanical system which includes a piezoelectric or electroactive polymer element of the device according to the invention.

As shown in part in FIG. 2, balance spring 3 is made in a known manner by means of a wire or metal strip which is generally less than 0.3 mm thick, for example around 0.025 to 0.045 mm. Prior to preferably hot winding metal strip 24 in the shape of a spiral with the coils spaced out from each other, at least one piezoelectric or electroactive polymer layer 23 is deposited on one of the faces of metal strip 24. This piezoelectric layer may be formed, for example, of titanium oxide preferably less than 0.1 mm thick. A first piezoelectric or electroactive polymer layer 23 may also be deposited on a face designated the external face and a second piezoelectric or electroactive polymer layer 23' on another face designated the internal face. When the metal strip with the piezoelectric or electroactive polymer layers 23, 23' is wound, the internal face is the one opposite the rotating balance staff, whereas the external face is opposite the internal face.

Preferably, the piezoelectric or electroactive polymer layers 23, 23' are deposited over the entire length of metal strip 24, but it is also possible to envisage only coating a portion of the strip with one or several piezoelectric or electroactive polymer layers. It is also possible to envisage making the strip entirely of piezoelectric material or an electroactive polymer material, for example of circular or rectangular transverse section.

When balance 2 oscillates with balance spring 3, a compression force or an extension force is alternately applied to the piezoelectric or electroactive polymer layers, which thus generate an alternating voltage. The oscillation frequency of balance 2 with balance spring 3 may be between 3 and 10 Hz. Autoregulating circuit 10 is thus electrically connected to the two piezoelectric or electroactive polymer layers to receive this alternating voltage. The autoregulating circuit may be connected directly or via two metal wires to two terminals of the piezoelectric or electroactive polymer layers.

Figure 3:
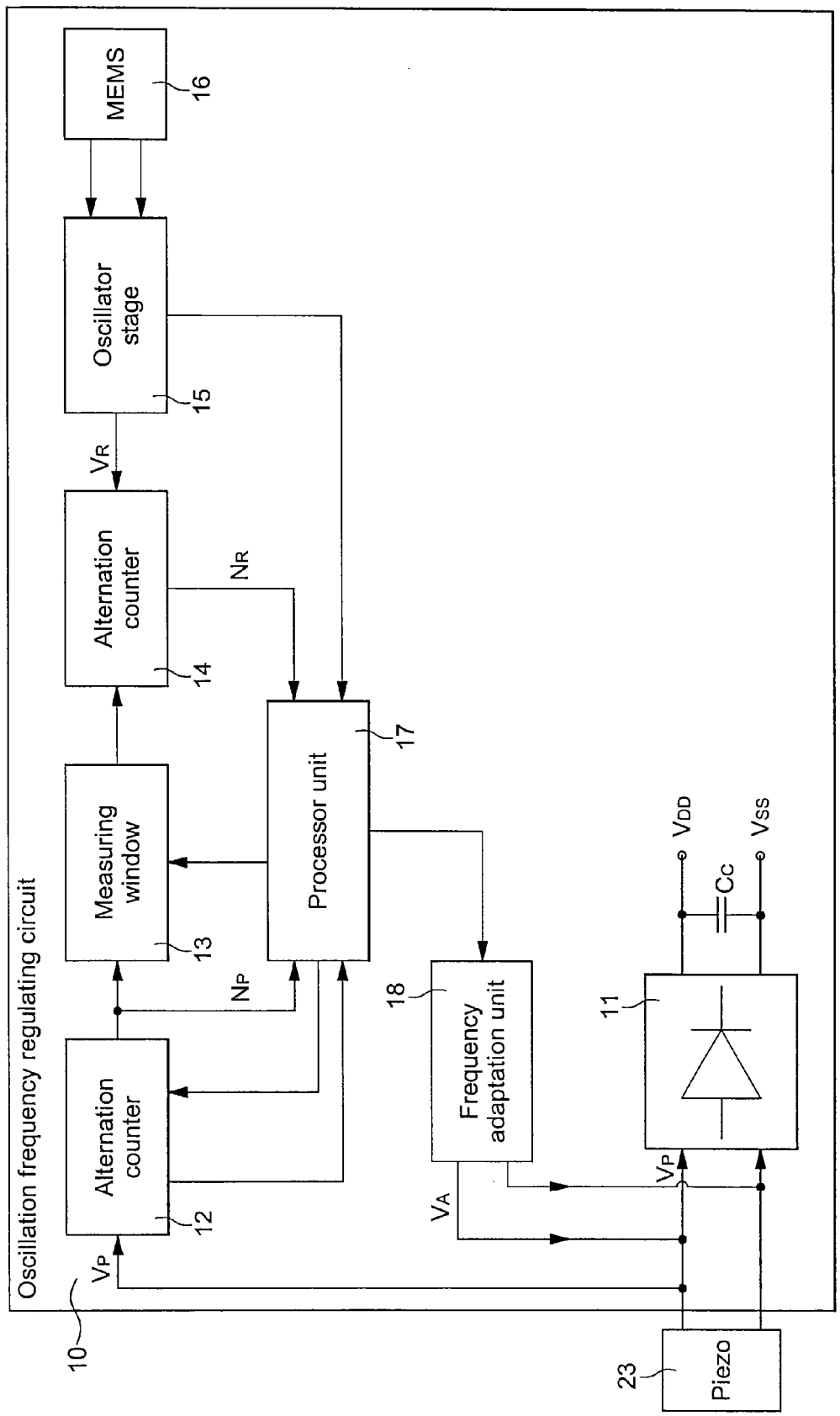
FIG. 3 shows a simplified block diagram of the electronic components of the autoregulating circuit according to the invention, which is connected to the piezoelectric element or the electroactive polymer element of the oscillating mechanical system.

FIG. 3 shows the various electronic elements of autoregulating circuit 10 for regulating the oscillation frequency of the oscillating mechanical system. Autoregulating circuit 10 is connected to two terminals of the piezoelectric or electroactive polymer element 23 which is placed on the balance spring of the oscillating mechanical system, such as the balance. Autoregulating circuit 10 is capable of rectifying the alternating voltage $V_P$ received from piezoelectric or electroactive polymer element 23 via a conventional rectifier 11. The rectified voltage of alternating voltage $V_P$ is stored in a capacitor Cc. This rectified voltage between terminals $V_{DD}$ and $V_{SS}$ of capacitor Cc may be sufficient to power all the electronic elements of the autoregulating circuit without the use of an additional voltage source such as a battery.

Autoregulating circuit 10 includes an oscillator stage 15 connected to a MEMS resonator 16. The oscillating circuit of the oscillator stage with the MEMS resonator supplies an oscillating signal, which can have a frequency of less than 500 kHz, for example around 200 kHz. Thus, oscillator stage 15 may preferably supply a reference signal $V_R$, the frequency of which may be equal to the frequency of the oscillating signal from the oscillator circuit.

It is also possible to envisage the oscillator stage including at least one frequency divider for dividing the oscillating signal frequency, so as to supply a reference signal $V_R$ at a divided frequency relative to the oscillating signal frequency. In such case, the frequency of reference signal $V_R$ may be of the same order as the alternating voltage frequency $V_P$ generated by the piezoelectric or electroactive polymer element.

The MEMS resonator may be made in a thick, SOI type, monolithic silicon substrate. The same substrate may also be used for integrating all of the other components of autoregulating circuit 10. To achieve this, another thin SOI layer may be deposited on the thick SOI substrate to integrate the other electronic components. Thus the autoregulating circuit may form a single compact electronic module for regulating the oscillation frequency of the oscillating mechanical system. The autoregulating circuit produced may also be encapsulated in a conventional manner in opaque plastic material. This reduces the interconnections with other external elements and also reduces electric power consumption.

It is to be noted that it is also possible to envisage making the MEMS resonator in a first monolithic silicon substrate. The MEMS resonator may be placed on or beside a second silicon monolithic substrate integrating the other components of the autoregulating circuit. The two substrates are encapsulated in a conventional opaque plastic material to form a single compact module.

In order to be able to regulate the oscillation frequency of the oscillating mechanical system, a comparison between the alternating voltage $V_P$ and reference signal $V_R$ must be made in autoregulating circuit 10. To achieve this, autoregulating circuit 10 includes a means of comparison 12, 13, 14, 17 for comparing the frequency of alternating voltage $V_P$ to the frequency of reference signal $V_R$. If the reference signal frequency matches the oscillating signal frequency from oscillator stage 15, i.e. a frequency on the order of 200 kHz, the comparison means must be devised to take account of the significant frequency gap between alternating voltage $V_P$ and reference signal $V_R$.

The comparison means is formed first of all by a first alternation counter 12, which receives at input the alternating voltage $V_P$ from the piezoelectric or electroactive polymer element and which supplies a first counting signal $N_P$ to a processor unit 17. The comparison means further includes a second alternation counter 14, which receives the reference signal $V_R$ at input, and which supplies a second counting signal $N_R$ to the processor unit 17.

To take account of the frequency gap between the alternating voltage $V_P$ and reference signal $V_R$, a measuring window 13 is arranged between the first alternation counter 12 and second alternation counter 14. This measuring window 13 determines the counting time of the second alternation counter 14. Processor unit 17 supplies configuration parameters to the measuring window 13 to determine the counting time for the second alternation counter. These configuration parameters are stored in a memory (not shown) in the processor unit. These configuration parameters may be different depending on whether the watch is a ladies' or men's watch. The various operations processed in processor unit 17 may be controlled by a clock signal supplied, for example, by the oscillator circuit of oscillator stage 15.

The counting time of the second alternation counter 14 is proportionately adapted to the counting time of a certain determined number of alternations counted by the first alternation counter in the first counting signal $N_P$. The processor unit may also control the first alternation counter 12 to define the start and end of a counting period. However, it is also possible to envisage the first alternation counter 12 supplying information as to the start and end of a determined number of counted alternations to the processor unit. If, for example, 200 alternations are to be counted in the first alternation counter, the measuring window 13 is configured so that the second alternation counter 14 counts a number of alternations of reference signal $V_R$ during a time period which is around 5000 times shorter. This time period may also be dependent on the counting time, for example on the 200 alternations of the first alternation counter. This reduces the electric power consumption of the autoregulating circuit.

The start of counting controlled by measuring window 13 may be determined by the first alternation counter 12 but may also preferably be directly controlled by processor unit 17. The processor unit can first of all receive the first counting signal $N_P$ relating to a first determined number of counted alternations of alternating voltage $V_P$ in a first time period. This first counting signal is stored for example in a register of the processor unit. Subsequently, the processor unit may receive the second counting signal $N_R$ relating to a second number of counted alternations in the second alternation counter 14 in a second time period controlled by measuring window 13. This second counting signal $N_R$ may also be stored in another register of the processor unit. Finally, the two counting signals are compared in the processor unit to determine whether the frequency of alternating voltage $V_P$ is proportionately too high or too low relative to the reference signal frequency.

On the basis of the comparison made between the two counting signals $N_P$ and $N_R$ in the processor unit, said processor unit operates a frequency adaptation unit 18, the output of which is connected to the terminals of the piezoelectric or electroactive polymer element 23. This frequency adaptation unit 18 may be arranged to provide a frequency adaptation signal, which is a continuous voltage $V_A$, the level of which is a function of the difference between the two counting signals communicated by the processor unit. A switchable array of capacitors or resistors may be provided for this purpose. A continuous voltage value may be provided by a voltage follower of adaptation unit 18 to one of the terminals of the piezoelectric or electroactive polymer element 23 or to the other terminal of the piezoelectric or electroactive polymer element. This therefore induces a certain force on the piezoelectric or electroactive polymer element to brake or accelerate the oscillation of the oscillating mechanical system as a function of the comparison of the two counting signals.

The continuous voltage with a certain value $V_A$ may be supplied by the frequency adaptation unit 18 at determined time periods, which can be programmed in the processor unit. Several electronic components of the autoregulating circuit may also be arranged to be switched only on at determined time periods to save energy. For example, measuring window 13, second alternation counter 14, oscillator stage 15 connected to MEMS resonator 16 and a part of processor unit 17 may be left in rest mode and switched on at determined time periods to regulate the oscillation frequency. First alternation counter 12, which operates at a very low frequency, may however be continuously on and be used to control the switching on of the other parts of autoregulating circuit 10 after a certain number of counted alternations of alternating voltage $V_P$.

If the oscillation frequency of the oscillating mechanical system has been adapted, the drop out time, particularly of oscillator stage 15, may be extended. In these conditions, most of the idle electronic components of the autoregulating circuit can be switched on for example every minute, which greatly reduces the electric power consumption of the auto-regulating circuit. In these conditions, capacitor Cc, which stores a rectified supply voltage, is hardly unloaded at all, since only an occasional larger use of energy occurs when the frequency comparison is made between reference signal $V_R$ and alternating signal $V_P$.

Autoregulating circuit 10 may also include well known thermal compensation elements, and a reset unit for each time that autoregulating circuit 10 is switched on. All the electronic components of the autoregulating circuit and MEMS resonator 16 and capacitor Cc form part of the same compact electronic module. All these electronic components can advantageously be integrated in the same monolithic silicon substrate, which means that only one self-powered electronic module is needed for regulating the frequency of the oscillating mechanical system.

If oscillator stage 15 supplies a reference signal $V_R$ at a divided frequency matching a desired frequency of alternating voltage $V_P$ of the piezoelectric or electroactive polymer element 23, the counting time of the second alternation counter 14 may be directly controlled by the first alternation counter 12. The number of alternations $N_P$ of alternating voltage $V_P$ may be directly compared in processor unit 17 to the number of counted alternations $N_R$ in the second alternation counter 14.

From the description that has just been given, several variants of the circuit for autoregulating the oscillation frequency of an oscillating mechanical system and the device in which it is contained can be devised by those skilled in the art without departing from the scope of the invention defined by the claims. The oscillating mechanical system may be an acoustic system. The oscillation frequency of the oscillating mechanical system may be adapted by placing a certain number of capacitors in parallel with the piezoelectric or electroactive polymer element on the basis of the frequency comparison between the alternating voltage and the reference signal. It is possible to envisage depositing a composite metal-ion layer on the balance spring to be used for the same purpose as the piezoelectric element.

What is claimed is:

1. An auto-regulating circuit to auto-regulate the oscillation frequency of an oscillating mechanical system, wherein the mechanical system includes a piezoelectric or electroactive polymer element configured to generate an alternating voltage following the oscillation of the mechanical system, the auto-regulating circuit being connected to the piezoelectric or electroactive polymer element to adapt the oscillation frequency of the oscillating mechanical system, and the auto-regulating circuit comprising:

a rectifier configured to rectify the alternating voltage generated by the piezoelectric or electroactive polymer element and to store the rectified voltage in at least one capacitor in order to supply the auto-regulating circuit with electricity, an oscillator stage, which includes an oscillating circuit connected to a MEMS resonator, to supply a reference signal, a comparison circuit configured to compare the frequency of the alternating voltage to the frequency of the reference signal, a frequency adaptor connected to the piezoelectric or electroactive polymer element and configured to supply a frequency adaptation signal to the piezoelectric or electroactive polymer element on the basis of the result of the comparison in the comparison circuit in order to regulate the oscillation frequency of the oscillating mechanical system, and all electronic components of the auto-regulating circuit being grouped together to form a single electronic module, wherein the comparison circuit includes a first alternation counter configured to count a first number of alternations of the alternating voltage of the piezoelectric or electroactive polymer element in a first determined time period and to supply a first counting signal to a processor, a second alternation counter and measuring window arranged between the first alternation counter and the second alternation counter, in which said measuring window is configured by configuration parameters supplied by the processor by taking into account the first counting signal relating to the first number of counted alternations of alternating voltage in the first determined time period, the second alternation counter being configured to count a second number of alternations of the reference signal supplied by the oscillator stage in a second determined time period determined by the measuring window on the basis of the first determined time period proportionately to the counting time of the number of alternations counted by the first alternation counter in the first counting signal, and to supply a second counting signal to the processor, for which the processor is configured to compare the first counting signal to the second counting signal so as to control the frequency adaptor on the basis of the result of the comparison.

2. The auto-regulating circuit according to claim 1, wherein the MEMS resonator is made in a monolithic silicon substrate, on all the other electronic components of the auto-regulating circuit are integrated, so as to form a single compact module.

3. The auto-regulating circuit according to claim 1, wherein the MEMS resonator is made in a first monolithic silicon substrate, which is placed on or beside a second monolithic silicon substrate on which the other components of the auto-regulating circuit are integrated, the two substrates being encapsulated to form a single compact module.

4. The auto-regulating circuit according to claim 1, wherein the oscillator stage is configured to supply a reference signal of identical frequency to the frequency of the oscillating signal from the oscillating circuit.

5. The auto-regulating circuit according to claim 4, wherein the oscillator stage is configured to supply a reference signal with a frequency higher than or equal to 200 kHz.

6. The auto-regulating circuit according to claim 5, wherein the measuring window is configured so that the second alternation counter counts a number of alternations of the reference signal during a time period of 5000 times or shorter.

7. The auto-regulating circuit according to claim 1, wherein the oscillator stage includes a frequency divider configured to divide the frequency of the oscillating signal, in order to supply a reference signal, the frequency of which is defined according to the desired adaptation frequency of the alternating voltage of the piezoelectric or electro-active polymer element, and wherein the processor controls a counting operation of the first and second alternation counters with a first counting period which is the same as the second counting period.

8. The auto-regulating circuit according to claim 1, wherein the frequency adaptor is configured to supply a continuous adaptive voltage to the piezoelectric or electroactive polymer element according to the result of the comparison in the processor of the comparison circuit.

9. The auto-regulating circuit according to claim 8, wherein the frequency adaptor is configured to supply a continuous adaptive voltage in determined time periods.

10. The auto-regulating circuit according to claim 1, wherein the first alternation counter is configured to switch on the oscillator stage, the second alternation counter and a part of the processor at determined periods for the frequency comparison, and outside the determined periods, the oscillator stage, the second alternation counter and a part of the processor are not powered by the rectified voltage in the capacitor.

11. A device including an oscillating mechanical system and the auto-regulating circuit configured to auto-regulate the oscillation frequency of the oscillating system according to claim 1, wherein the oscillating mechanical system includes a piezoelectric or electroactive polymer element configured to generate an alternating voltage at a frequency matching the oscillation frequency of the oscillating mechanical system, two terminals of the piezoelectric or electroactive polymer element being connected to the auto-regulating circuit so as to receive from the auto-regulating circuit a frequency adaptation signal on the basis of a frequency comparison between the alternating voltage and a reference signal from an oscillator stage of the auto-regulating circuit.

12. The device according to claim 11, wherein the oscillating mechanical system is a balance of a watch, in which there is mounted a balance spring, which carries the piezoelectric or electro-active polymer element.

13. The device according to claim 12, wherein the piezoelectric or electroactive polymer element includes at least one piezoelectric or electroactive polymer layer arranged on at least one surface of a metal strip of the balance spring.

14. The device according to claim 13, wherein the piezoelectric or electroactive polymer element includes a first piezoelectric or electroactive polymer layer arranged on an external face of the metal strip and a second piezoelectric or electroactive polymer layer arranged on an internal face of the metal strip, wherein a first connecting terminal of the piezoelectric or electroactive polymer element is fixed to the first piezoelectric or electro-active polymer layer, and wherein a second connecting terminal of the piezoelectric or electroactive polymer element is fixed to the second piezoelectric or electroactive polymer layer, the first and second terminals being connected to the auto-regulating circuit.

15. The device according to claim 14, wherein the first and second piezoelectric or electroactive polymer layers are deposited on a part or the entire length of the internal and external faces of the metal strip.

16. An auto-regulating circuit configured to auto-regulate the oscillation frequency of an oscillating mechanical system, wherein the mechanical system includes a piezoelectric or electro-active polymer element configured to generate an alternating voltage following the oscillation of the mechanical system, the auto-regulating circuit being connected to the piezoelectric or electro-active polymer element to adapt the oscillation frequency of the oscillating mechanical system, and the auto-regulating circuit comprising:

a rectifier configured to rectify the alternating voltage generated by the piezoelectric or electro-active polymer element and to store the rectified voltage in at least one capacitor in order to supply the auto-regulating circuit with electricity, an oscillator stage, which includes an oscillating circuit connected to a MEMS resonator, to supply a reference signal, a comparison circuit configured to compare the frequency of the alternating voltage to the frequency of the reference signal, a frequency adaptor connected to the piezoelectric or electro-active polymer element to supply a frequency adaptation signal to the piezoelectric or electro-active polymer element on the basis of the result of the comparison in the comparison circuit in order to regulate the oscillation frequency of the oscillating mechanical system, and all electronic components of the auto-regulating circuit being grouped together to form a single electronic module, wherein the comparison circuit includes a first alternation counter configured to count a first number of alternations of the alternating voltage of the piezoelectric or electro-active polymer element in a first determined time period and to supply a first counting signal to a processor, a second alternation counter and a measuring window arranged between the first alternation counter and the second alternation counter, in which said measuring window is configured by configuration parameters supplied by the processor taking into account the first counting signal relating to the first number of counted alternations of alternating voltage in the first determined time period, the start of said measuring window being configured to count a second number of alternations of the reference signal supplied by the oscillator stage in a second determined time period determined by the measuring window on the basis of the first determined time period proportionately to the counting time of the number of alternations counted by the first alternation counter in the first counting signal, and to supply a second counting signal to the processor, for which the processor is configured to compare the first counting signal to the second counting signal so as to control the frequency adaptor on the basis of the result of the comparison.

\* \* \* \* \*